United States Patent
Gopinath et al.

(10) Patent No.: US 6,989,331 B2
(45) Date of Patent: Jan. 24, 2006

(54) HARD MASK REMOVAL

(75) Inventors: Venkatesh Gopinath, Fremont, CA (US); Arvind Kamath, Mountain View, CA (US); Mohammad R. Mirabedini, Redwood City, CA (US); Ming-Yi Lee, Fremont, CA (US); Brian A. Baylis, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 282 days.

(21) Appl. No.: 10/615,558

(22) Filed: Jul. 8, 2003

(65) Prior Publication Data

US 2005/0006347 A1 Jan. 13, 2005

(51) Int. Cl.
*H01L 21/302* (2006.01)

(52) U.S. Cl. .................. 438/705; 438/745; 438/756
(58) Field of Classification Search .............. 438/705, 438/745, 756, 738
See application file for complete search history.

(56) References Cited

U.S. PATENT DOCUMENTS

| | | | | |
|---|---|---|---|---|
| 6,207,517 B1 * | 3/2001 | Muller | .................. | 438/301 |
| 6,285,057 B1 * | 9/2001 | Hopper et al. | .............. | 257/330 |
| 6,326,300 B1 * | 12/2001 | Liu et al. | .................... | 438/638 |
| 6,573,193 B2 * | 6/2003 | Yu et al. | .................... | 438/770 |

* cited by examiner

*Primary Examiner*—Brad Smith
(74) *Attorney, Agent, or Firm*—Luedeka, Neely & Graham, P.C.

(57) ABSTRACT

A method of removing a hard mask layer from a patterned layer formed over an underlying layer, where the hard mask layer is removed using an etchant that detrimentally etches the underlying layer when the underlying layer is exposed to the etchant for a length of time typically required to remove the hard mask layer, without detrimentally etching the underlying layer. The hard mask layer is modified so that the hard mask layer is etched by the etchant at a substantially faster rate than that at which the etchant etches the underlying layer. The hard mask layer is patterned. The patterned layer is etched to expose portions of the underlying layer. Both the hard mask layer and the exposed portions of the underlying layer are etched with the etchant, where the etchant etches the hard mask layer at a substantially faster rate than that at which the etchant etches the underlying layer, because of the modification of the hard mask layer.

20 Claims, 2 Drawing Sheets

HARD MASK REMOVAL

FIELD

This invention relates to the field of integrated circuit fabrication. More particularly, this invention relates to removing hard mask materials that are used to define fine structures within an integrated circuit.

BACKGROUND

Consumers continually pressure integrated circuit manufacturers to provide devices that are smaller and faster, so that more operations can be performed in a given amount of time, using fewer devices that occupy a reduced amount of space and generate less heat. For many years, the integrated circuit fabrication industry has been able to provide smaller and faster devices, which tend to double in capacity every eighteen months or so.

However, as integrated circuits become smaller, the challenges of fabricating the devices tend to become greater. Fabrication processes and device configurations that didn't present any problems at a larger device size tend to resolve into new problems to be overcome as the device size is reduced. For example, gate lengths of metal oxide semiconductor type transistors have been dramatically shortened over the last several years. The reduction in the gate length has introduced a wide variety of new issues that engineers and scientists are working to overcome.

As a specific example, gate electrode materials such as polysilicon have typically been patterned using a photoresist mask and a dry etch. However, photoresist tends to degrade to a certain degree during a dry etch, such as erosion of the photoresist at the edge of the mask. While such edge anomalies had relatively little effect on a relatively wide gate electrode, an edge anomaly such as this tends to have a commensurately greater effect on a relatively narrow gate electrode.

Thus, other materials besides photoresist have been used as masking materials for such critical etch processes. For example, silicon dioxide has been used as a so-called hard mask for the patterning of gate electrodes and other structures within integrated circuits. While the use of these other materials as hard masks tends to reduce the problems with anomalies at the edges of the mask pattern, other problems have arisen from their use. For example, when the etch for which the hard mask has been formed is completed, it is typically desirable to remove the hard mask. However, such hard mask materials tend to be more difficult to remove than photoresist. Thus, in removing the hard mask material from the integrated circuit, other underlying layers are often damaged or otherwise negatively affected. To continue the specific example introduced above of a silicon dioxide hard mask that is used to pattern a polysilicon gate electrode, removing the silicon dioxide hard mask often etches the underlying gate insulation layer, which is also typically formed of a silicon dioxide.

What is needed, therefore, is a method by which a hard mask can be used to pattern structures on an integrated circuit, without unduly damaging underlying layers when the hard mask is removed.

SUMMARY

The above and other needs are met by a method of removing a hard mask layer from a patterned layer formed over an underlying layer, where the hard mask layer is removed using an etchant that detrimentally etches the underlying layer when the underlying layer is exposed to the etchant for a length of time typically required to remove the hard mask layer, without detrimentally etching the underlying layer. The hard mask layer is modified so that the hard mask layer is etched by the etchant at a substantially faster rate than that at which the etchant etches the underlying layer. The hard mask layer is patterned. The patterned layer is etched to expose portions of the underlying layer. Both the hard mask layer and the exposed portions of the underlying layer are etched with the etchant, where the etchant etches the hard mask layer at a substantially faster rate than that at which the etchant etches the underlying layer, because of the modification of the hard mask layer.

By modifying the hard mask layer in this manner, the etchant etches the hard mask layer at an accelerated rate. Thus, the length of time required to remove the hard mask from the patterned layer is substantially reduced. Further, by reducing the length of time that the underlying layer is exposed to the etchant while the hard mask layer is removed, the amount of damage done to the underlying layer, such as undercutting the underlying layer at the bottom edges of the patterned layer, is substantially reduced and preferably eliminated to any detrimental degree. Thus, a preferred method of the present invention as described herein allows for the use of a hard mask layer that is formed of a material that is similar to an underlying layer, without causing substantial damage to the underlying layer when the hard mask layer is removed.

In various preferred embodiments, the step of modifying the hard mask layer is accomplished prior to the step of patterning the hard mask layer. Alternately, the step of modifying the hard mask layer is accomplished subsequent to the step of patterning the hard mask layer. Further, the step of modifying the hard mask layer may be accomplished subsequent to the step of etching the patterned layer and prior to the step of etching both the hard mask layer and the exposed portions of the underlying layer. Preferably, the step of patterning the hard mask layer comprises applying and patterning a photoresist layer and etching the hard mask layer.

The step of modifying the hard mask layer preferably comprises damaging a crystal structure of the hard mask layer, most preferably with ion implantation, such as ion implantation of at least one of argon, arsenic, and nitrogen. In one embodiment, the hard mask layer and the underlying layer are both formed of silicon dioxide. In this embodiment, the hard mask layer preferably comprises silicon dioxide formed with a low temperature oxidation process and the underlying layer most preferably comprises silicon dioxide formed with a thermal oxidation process. The hard mask layer preferably has a thickness of from about two hundred angstroms to about five hundred angstroms and the underlying layer preferably has a thickness of about twenty angstroms. Preferably, the etchant comprises a dilute aqueous solution of hydrofluoric acid. In a most preferred embodiment the underlying layer is a gate insulation layer and the patterned layer is a gate electrode layer.

In another embodiment silicon oxynitride is used as the material for the hard mask layer, and an aqueous solution of phosphoric acid is used to remove the hard mask layer. Implanting silicon oxynitride with a damaging species such as nitrogen results in an increase in wet etch rate of over two fold over the undamaged material. Silicon oxynitride is preferred in some embodiments because it has both hard mask and anti-reflective coating properties.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
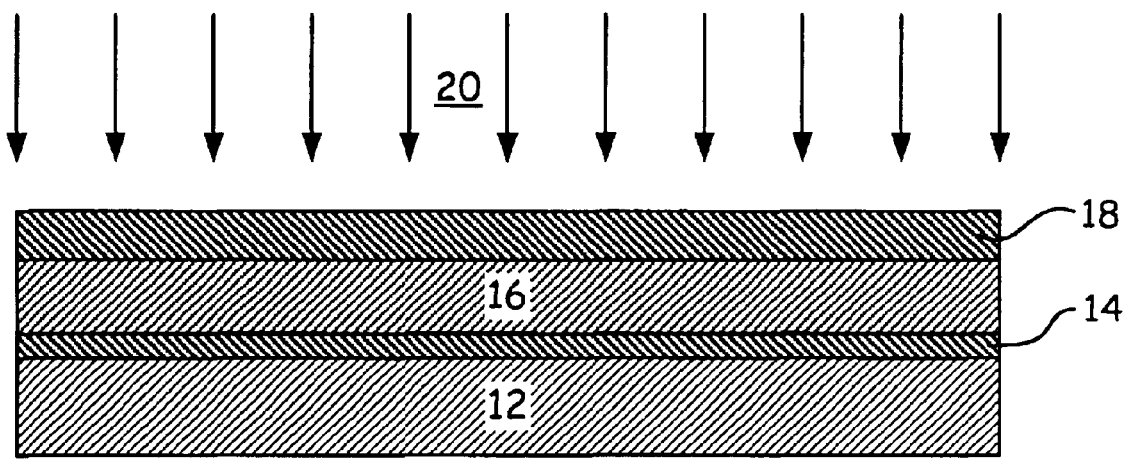
FIG. 1 is a cross sectional view a portion of an integrated circuit, where an underlying layer is formed on a substrate, a patterned layer is formed on the underlying layer, and a hard mask layer is formed on the patterned layer, where the hard mask layer is being modified.

With reference now to FIG. 1 there is depicted a cross sectional view a portion of an integrated circuit 10, where an underlying layer 14 is formed on a substrate 12, a patterned layer 16 is formed on the underlying layer 14, and a hard mask layer 18 is formed on the patterned layer 16. The substrate 12 is preferably a semiconducting substrate, such as one or more of silicon, germanium, or a III–V compound such as gallium arsenide. There are preferably other structures formed or to be formed in and above the substrate 12, which are not depicted so as to focus attention on other aspects of the invention.

The underlying layer 14 is in one embodiment a gate insulation layer. In this embodiment, the underlying layer 14 is preferably formed of silicon dioxide that is formed in a thermal oxidation process, to a thickness of about twenty angstroms. In this same embodiment, the patterned layer 16 is preferably a gate electrode layer, formed of a relatively amorphous and electrically conductive material, such as doped polysilicon. In this embodiment, the hard mask layer 18 is most preferably silicon dioxide that is formed in a low temperature oxide process to a thickness of between about two hundred angstroms and about five hundred angstroms.

In this most preferred embodiment, the general purpose of the hard mask layer 18 is to provide a durable masking layer during the formation of the gate electrodes in the patterned layer 16. As mentioned above, during such an etch, a photoresist layer may tend to degrade at the edges, which in turn tends to produce poorly defined gate electrodes. The hard mask layer 18 tends to adhere to the patterned layer 16 much better than does a photoresist layer, and also tends to be more durable. Thus the use of the hard mask layer 18 tends to produce gate electrodes that are more properly defined.

However, as introduced above, there is a problem that occurs when the hard mask layer 18 is removed. Silicon oxide layers are typically removed using a dilute aqueous solution of hydrofluoric acid. Thus, such an etchant is preferably used to remove the hard mask layer 18 when the patterned layer 16 has been patterned. However, the etchant that removes the hard mask layer 18 also etches exposed portions of the underlying layer 14, as it is also preferably formed of silicon dioxide. Because the underlying layer 14 is thermal oxide and the hard mask layer 18 is low temperature oxide, the underlying layer 14 etches at a rate that is only about twenty percent of the etch rate of the hard mask layer 18. However, because the hard mask layer 18 is so much thicker than the underlying layer 14, the underlying layer 14 tends to be significantly etched at its exposed edge between the substrate 12 and the patterned edges of the patterned layer 16. This undercutting of the patterned layer 16 tends to degrade the functional characteristics of the gate electrodes or other structures that are formed in the patterned layer 16.

To alleviate this condition, the hard mask layer 18 is preferably modified at some point during processing so as to make the hard mask layer 18 etch at an even faster rate relative to the etch rate of those portions of the underlying layer 14 that are to remain in place. In a most preferred embodiment, the modification is accomplished by exposing the hard mask layer 18 to an ion bombardment 20, such as in an ion implantation process. A high energy ion implantation tends to increase the etch rate of the hard mask layer 18 by a factor of about three. Most preferably, the ion bombardment 20 is performed as a blanket implantation.

If the ion implantation is accomplished prior to the application of a photoresist layer by which the hard mask layer 18 is patterned, such as in the embodiment depicted in FIG. 1, then the implanted species is preferably one that will not interfere in any way with the application and adhesion of the photoresist to the hard mask layer 18. For example, the implantation of argon and arsenic would tend to sufficiently damage the crystal structure of the hard mask layer 18, such that its etch rate would be significantly enhanced, while at the same time the argon and arsenic ions would not interfere with a subsequent photomasking of the hard mask layer 18.

Figure 2:
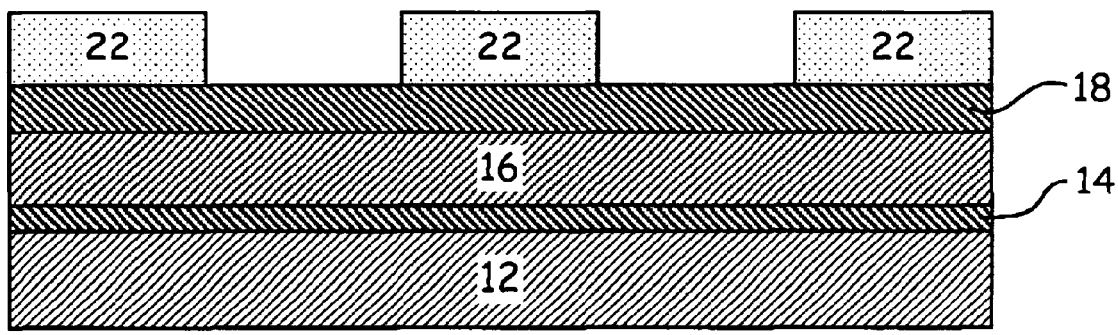
FIG. 2 is a cross sectional view of a patterning layer disposed on the hard mask layer.
Figure 3:
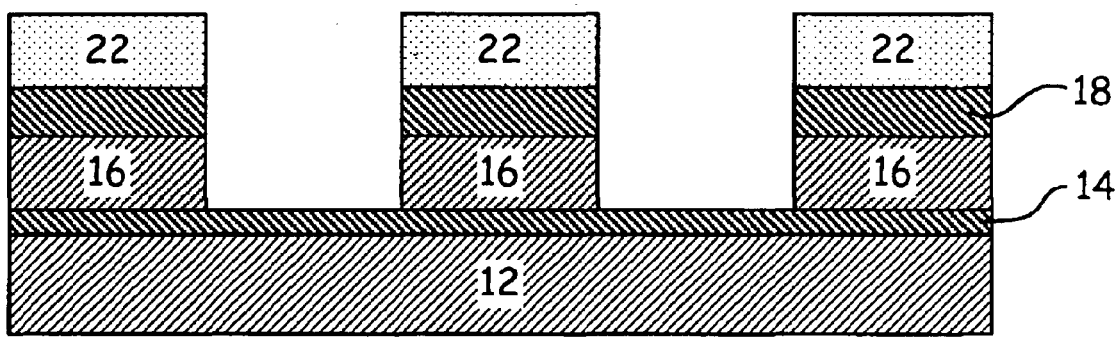
FIG. 3 is a cross sectional view of the hard mask layer and the patterned layer after they have been etched.

A layer of photoresist 22 is preferably applied to the hard mask layer 18, and patterned, as depicted in FIG. 2. A layer of an anti-reflective coating can also be applied to the hard mask layer 18 prior to the application of the photoresist 22, as desired. The hard mask layer 18 is then preferably etched with the pattern in the photoresist layer 22, as depicted in FIG. 3. The etch may be either a physical etch or a chemical etch such as in a dilute aqueous solution of hydrofluoric acid. After the hard mask layer 18 has been patterned, the patterned layer 16 is etched, again using either a physical etch or a chemical etch. The etched patterned layer 16 is also depicted in FIG. 3. The photoresist layer 22 may be removed either prior to the etch of the patterned layer 16, or after the etch of the patterned layer 16.

Figure 4:
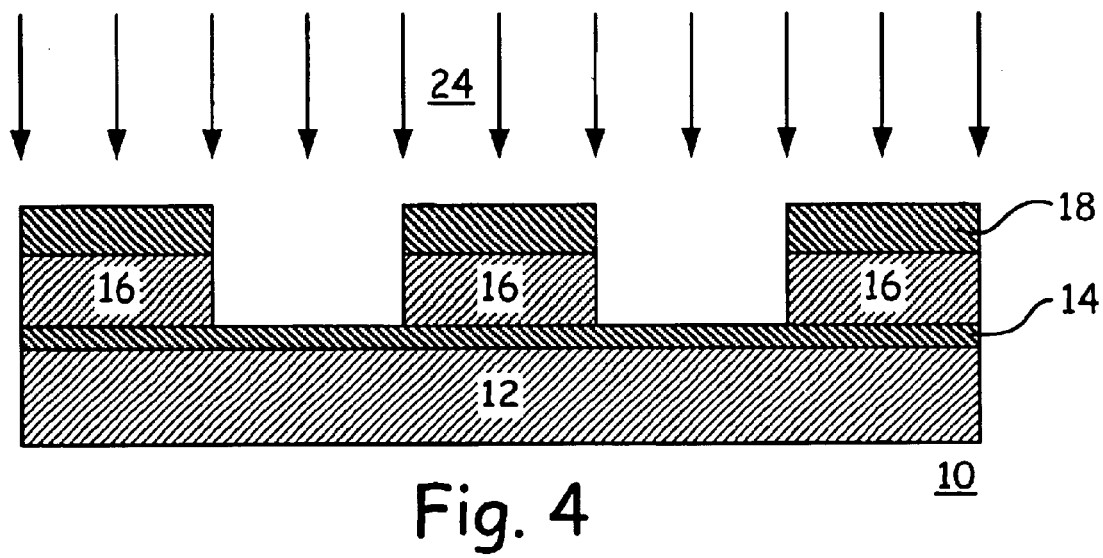
FIG. 4 is a cross sectional view of the hard mask layer and the exposed portions of the underlying layer being modified after the hard mask layer and the patterned layer have been etched.

FIG. 4 depicts the etched hard mask layer 18, where the photoresist mask 22 has been removed. As can be seen in both FIGS. 3 and 4, the underlying layer 14 is preferably left substantially unaffected after the patterned layer 16 has been etched. Thus, when the patterned layer 16 is etched, portions of the underlying layer 14 are exposed. At this point, it is desirable to remove the hard mask 18, so that further processing of the integrated circuit 10 can be accomplished. If the ion bombardment of the hard mask 18 has not as yet been accomplished, then in an alternate embodiment it is performed at this point in time, sometime after the hard mask layer 18 has been patterned and prior to the removal of the hard mask layer 18, such as immediately preceding the removal of the hard mask layer 18. Most preferably, the ion bombardment 24 is performed as a blanket implantation.

In yet another embodiment, the ion bombardment could be accomplished at more than one point in the processing as described. However, two or more such treatments are typically not required to achieve the desired benefits. If the ion bombardment 24 is accomplished after the photoresist patterning of the hard mask layer 18, then additional or alternate species can be used during the ion implantation, as there is no longer any concern with interfering with a photomasking process. For example, nitrogen could also be used for the ion bombardment 24, when accomplished at this point in the processing of the integrated circuit 10. It is noted that, if accomplished at this point in the processing, the ion bombardment 24 also damages the crystal structure of the exposed portions of the underlying layer 14, which will also cause them to etch at an increased rate. However, as it is intended that the exposed portions of the underlying layer 14 are also to be removed, this is not a problem.

The hard mask layer 18 is then preferably removed with an etchant, such as a dilute aqueous solution of hydrofluoric acid. At the same time that the hard mask layer 18 is being removed by the etchant, the exposed portions of the underlying layer 14 are also being removed by the etchant. If the ion bombardment was performed when portions of the underlying layer 14 were exposed, then those exposed portions also etch at a rate that is increase from their normal etch rate. However, if the ion bombardment was performed before portions of the underlying layer 14 were exposed, then they etch at their standard rate. However, in either case the exposed portions of the underlying layer 14 tend to be removed within the length of time required for the hard mask layer 18 to be removed.

Figure 5:
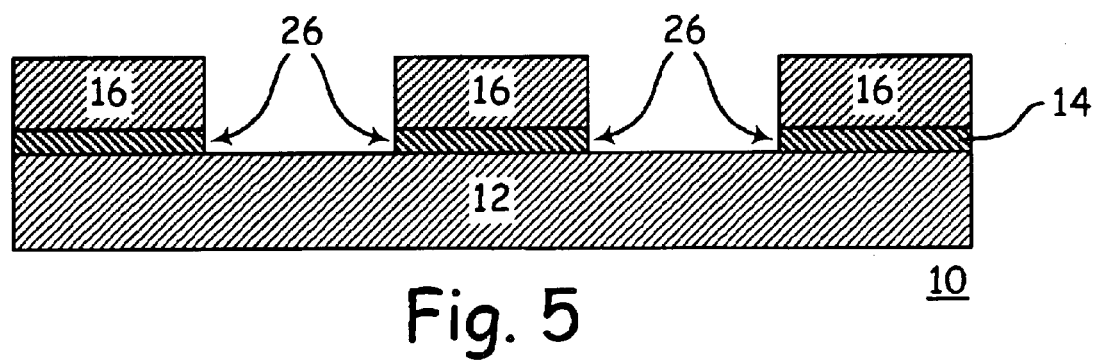
FIG. 5 is a cross sectional view of the patterned layer and the underlying layer after the hard mask layer has been removed.

The finished structure is depicted in FIG. 5. Because the hard mask layer 18 has been modified in the manner as described above, the length of time required to completely remove the hard mask layer 18 in the etchant is reduced. Thus, the amount of undercutting at points 26 beneath the etched structures of the patterned layer 16 is also significantly reduced. Thus, the methods as described above tend to enhance the structural characteristics of the integrated circuit 10.

In one embodiment silicon oxynitride is used as the material for the hard mask layer 18, and an aqueous solution of phosphoric acid is used to remove the hard mask layer 18. Implanting silicon oxynitride with a damaging species such as nitrogen results in an increase in wet etch rate of over two fold over the undamaged material. Silicon oxynitride is preferred in some embodiments because it has both hard mask and anti-reflective coating properties.

The methods as described above can be applied in situations other than the formation of gate electrodes, and are generally applicable whenever a hard mask layer 18 is to be removed from a patterned layer 16, and there is an underlying layer 14 that can be undercut during the removal process. For example, such a situation also exists with a silicon trench etch, when a nitride hard mask layer 18 is to be removed from a silicon layer 16, without undercutting the pad oxide layer 14.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of removing a hard mask layer from an upper surface of a patterned layer, which is formed over an underlying layer, where the hard mask layer is removed using an etchant that detrimentally etches the underlying layer when the underlying layer is exposed to the etchant for a length of time typically required to remove the hard mask layer, without detrimentally etching the underlying layer, the method comprising the steps of:

modifying all of the hard mask layer that is remaining on the upper surface of the patterned layer at a time when the modifying is accomplished, without modifying portions of the underlying layer that are to remain, so that the hard mask layer is etched by the etchant at a substantially faster rate than that at which the etchant etches the underlying layer in the unmodified portions that are to remain, patterning the hard mask layer to expose portions of the patterned layer, etching the patterned layer to expose portions of the underlying layer that are to be removed, and etching both the hard mask layer and the exposed portions of the underlying layer with the etchant, where the etchant etches the hard mask layer at a substantially faster rate than that at which the etchant etches the unmodified portions of the underlying layer, because of the modification of the hard mask layer.

2. The method of claim 1, wherein the step of modifying the hard mask layer is accomplished prior to the step of patterning the hard mask layer.

3. The method of claim 1, wherein the step of modifying the hard mask layer is accomplished subsequent to the step of patterning the hard mask layer.

4. The method of claim 1, wherein the step of modifying the hard mask layer is accomplished subsequent to the step of etching the patterned layer and prior to the step of etching both the hard mask layer and the exposed portions of the underlying layer.

5. The method of claim 1, wherein the step of patterning the hard mask layer comprises applying and patterning a photoresist layer and etching the hard mask layer.

6. The method of claim 1, wherein the step of modifying the hard mask layer comprises damaging a crystal structure of the hard mask layer.

7. The method of claim 1, wherein the step of modifying the hard mask layer comprises damaging a crystal structure of the hard mask layer with ion implantation.

8. The method of claim 1, wherein the step of modifying the hard mask layer comprises damaging a crystal structure of the hard mask layer by ion implantation of at least one of argon, arsenic, and nitrogen.

9. The method of claim 1, wherein the hard mask layer and the underlying layer are both formed of silicon dioxide.

10. The method of claim 1, wherein the hard mask layer comprises silicon dioxide formed with a low temperature oxidation process and the underlying layer comprises silicon dioxide formed with a thermal oxidation process.

11. The method of claim 1, wherein the hard mask layer has a thickness of from about two hundred angstroms to about five hundred angstroms and the underlying layer has a thickness of about twenty angstroms.

12. The method of claim 1, wherein the etchant comprises a dilute aqueous solution of hydrofluoric acid.

13. The method of claim 1, wherein the underlying layer is a gate insulation layer and the patterned layer is a gate electrode layer.

14. The method of claim 1, wherein the hard mask layer comprises silicon oxynitride formed with a deposition process.

15. The method of claim 1, wherein the etchant comprises an aqueous solution of phosphoric acid.

16. A method of using a hard mask layer to pattern a patterned layer formed over an underlying layer, where the hard mask layer is removed using an etchant that detrimentally etches the underlying layer when the underlying layer is exposed to the etchant for a length of time typically required to remove the hard mask layer, without detrimentally etching the underlying layer, the method comprising the sequential steps of:

forming the hard mask layer over the patterned layer, modifying all of the hard mask layer that is remaining on the patterned layer at a time when the modifying is accomplished, without modifying portions of the underlying layer that are to remain, so that the hard mask layer is etched by the etchant at a substantially faster rate than that at which the etchant etches the underlying layer in the unmodified portions that are to remain, patterning the hard mask layer to expose portions of the patterned layer, etching the patterned layer to expose portions of the underlying layer that are to be removed, and etching both the hard mask layer and the exposed portions of the underlying layer with the etchant, where the etchant etches the hard mask layer at a substantially faster rate than that at which the etchant etches the unmodified portions of the underlying layer, because of the modification of the hard mask layer.

17. The method of claim 16, wherein the step of modifying the hard mask layer comprises damaging a crystal structure of the hard mask layer with ion implantation.

18. The method of claim 16, wherein the hard mask layer and the underlying layer are both formed of one of silicon dioxide and silicon oxynitride.

19. A method of using a hard mask layer formed over a patterned layer to pattern the patterned layer formed, which is formed over an underlying layer, where the hard mask layer is removed using an etchant that detrimentally etches the underlying layer when the underlying layer is exposed to the etchant for a length of time typically required to remove the hard mask layer, without detrimentally etching the underlying layer, the method comprising the sequential steps of:

forming the hard mask layer over the patterned layer, patterning the hard mask layer, etching the patterned layer to expose portions of the underlying layer that are to be removed, modifying all of the hard mask layer that is remaining on the patterned layer, without modifying portions of the underlying layer that are to remain, so that the hard mask layer is etched by the etchant at a substantially faster rate than that at which the etchant etches the underlying layer in the unmodified portions that are to remain, and etching both the hard mask layer and the exposed portions of the underlying layer with the etchant, where the etchant etches the hard mask layer at a substantially faster rate than that at which the etchant etches the unmodified portions of the underlying layer, because of the modification of the hard mask layer.

20. The method of claim 19, wherein the step of modifying the hard mask layer comprises damaging a crystal structure of the hard mask layer with ion implantation.

* * * * *